(12) United States Patent
Kelekar

(10) Patent No.: US 8,882,919 B2
(45) Date of Patent: Nov. 11, 2014

(54) COMBINATORIAL NON-CONTACT WET PROCESSING

(75) Inventor: Rajesh Kelekar, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 891 days.

(21) Appl. No.: 12/977,306

(22) Filed: Dec. 23, 2010

(65) Prior Publication Data

US 2012/0164841 A1    Jun. 28, 2012

(51) Int. Cl.
| | | |
|---|---|---|
| H01L 21/30 | (2006.01) | |
| C23C 16/455 | (2006.01) | |
| C23C 16/52 | (2006.01) | |
| C23C 16/00 | (2006.01) | |
| H01L 21/00 | (2006.01) | |
| B05B 7/00 | (2006.01) | |
| B05C 5/00 | (2006.01) | |
| C40B 50/14 | (2006.01) | |
| B01J 19/00 | (2006.01) | |
| C40B 60/14 | (2006.01) | |

(52) U.S. Cl.
CPC .... *B01J 19/0046* (2013.01); *B01J 2219/00612* (2013.01); *B01J 2219/00605* (2013.01); *B01J 2219/00531* (2013.01); *C40B 50/14* (2013.01); *B01J 2219/00756* (2013.01); *B05B 7/00* (2013.01); *B05C 5/00* (2013.01); *B01J 2219/00596* (2013.01); *B01J 2219/00443* (2013.01); *C40B 60/14* (2013.01); *B01J 2219/0036* (2013.01)
USPC ........... 118/722; 118/313; 118/715; 118/300; 257/E21.211

(58) Field of Classification Search
None
See application file for complete search history.

(56) References Cited

U.S. PATENT DOCUMENTS

| | | | | |
|---|---|---|---|---|
| 6,203,619 | B1 * | 3/2001 | McMillan | ..................... 118/719 |
| 2008/0141936 | A1 * | 6/2008 | Pui et al. | ........................ 118/629 |
| 2008/0225248 | A1 | 9/2008 | Poon et al. | |
| 2012/0164841 | A1 | 6/2012 | Kelekar | |

\* cited by examiner

*Primary Examiner* — Dah-Wei D Yuan
*Assistant Examiner* — Jethro Pence

(57) ABSTRACT

An apparatus and method for combinatorial non-contact wet processing of a liquid material may include a source of a liquid material, a first reaction cell, a second reaction cell, a first plurality of gas jets disposed within an interior of the first reaction cell, the first plurality of gas jets configured to atomize the liquid material transferred to the interior of the first reaction cell, a second plurality of gas jets disposed within an interior of the second reaction cell, the second plurality of gas jets configured to atomize the liquid material transferred to the interior of the second reaction cell, a first vacuum element disposed along a periphery of the first reaction cell, and a second vacuum element disposed along a periphery of the at least a second reaction cell.

13 Claims, 14 Drawing Sheets

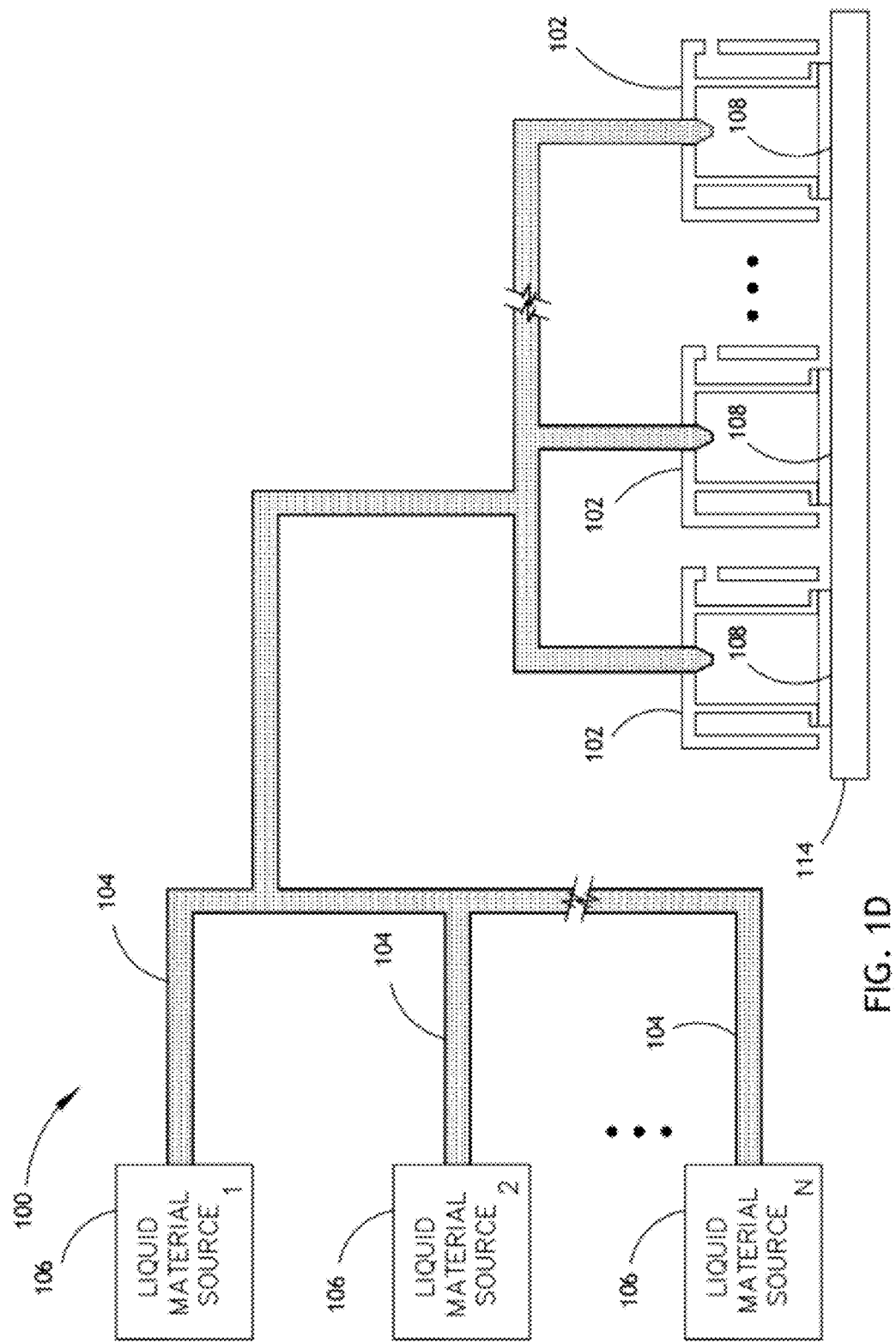

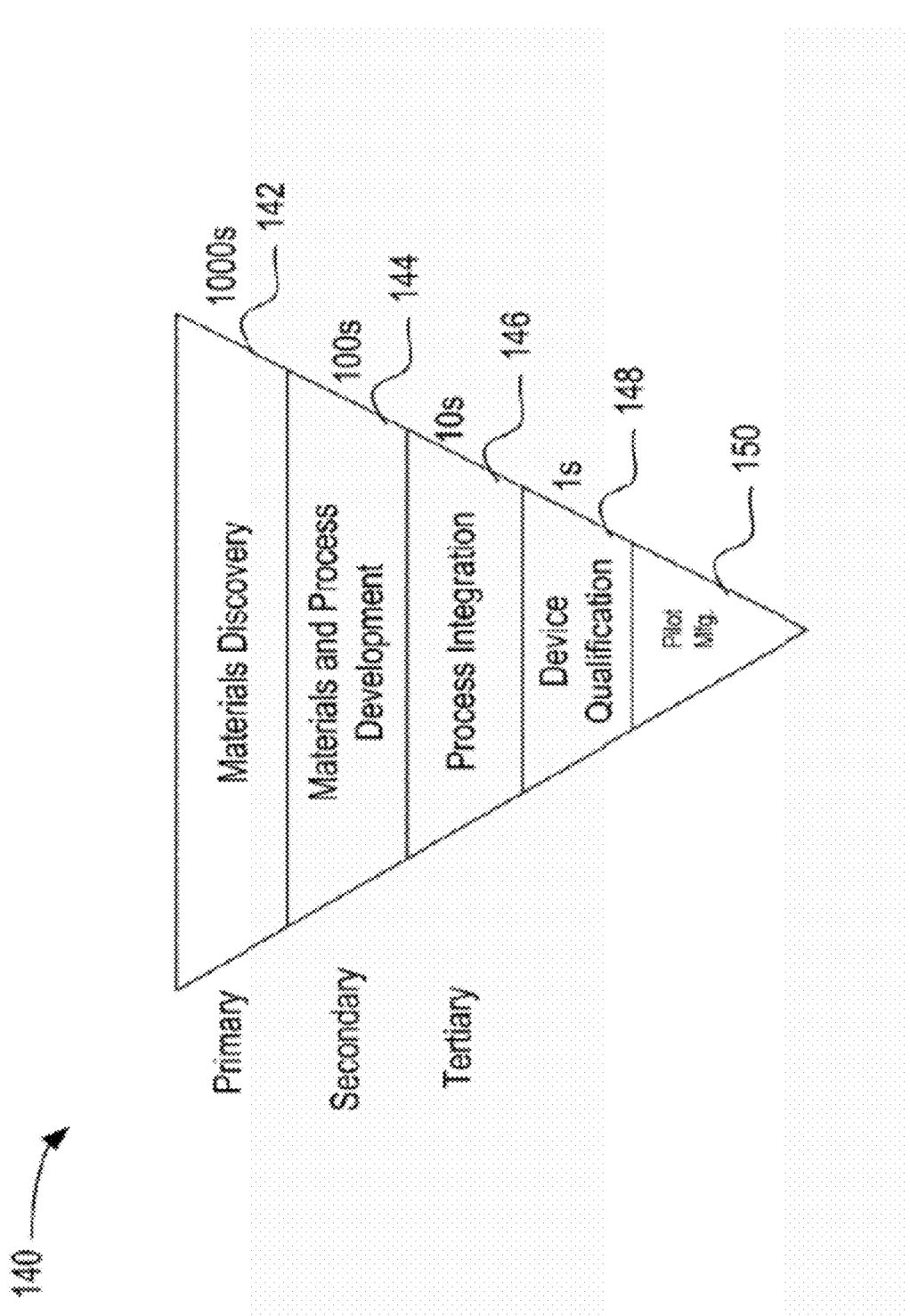

500

- 502 — providing a liquid material
- 504 — transporting a first portion of the liquid material from a source of the liquid material to a first reaction cell
- 506 — transporting at least a second portion of the liquid material from the source of the liquid material to at least a second reaction cell
- 508 — converting the first portion of the liquid material to a first atomized spray of liquid particles
- 510 — converting the at least a second portion of the liquid material to at least a second atomized spray of liquid particles
- 512 — containing a portion of the first atomized spray of liquid particles within a first selected region of the substrate
- 514 — containing a portion of the at least a second atomized spray of liquid particles within at least a second selected region of the substrate
- 516 — applying a portion of the first atomized spray of particles onto the first selected region of the substrate
- 518 — applying a portion of the at least a second atomized spray of particles onto the at least a second selected region of the substrate

FIG. 5

COMBINATORIAL NON-CONTACT WET PROCESSING

TECHNICAL FIELD

The present invention generally relates to the application of liquid material, and more particularly to the application of a liquid material utilizing a system and process for non-contact liquid material application onto a substrate.

BACKGROUND

As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner.

As an example, integrated circuit (IC) manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

The drive towards ever increasing performance of devices or systems of devices such as in systems on a chip (SOCs) has led to a dramatic increase in the complexity of process sequence integration and device integration, or the means by which the collection of unit processing steps are performed individually and collectively in a particular sequence to yield devices with desired properties and performance. This increase in complexity of device integration has driven the need for, and the subsequent utilization of increasingly complex processing equipment with precisely sequenced process modules to collectively perform an effective unit processing step.

The ability to process uniformly across an entire monolithic substrate and/or across a series of monolithic substrates is advantageous for manufacturing cost effectiveness, repeatability and control when a desired process sequence flow for IC manufacturing has been qualified to provide devices meeting desired yield and performance specifications. However, processing the entire substrate can be disadvantageous when optimizing, qualifying, or investigating new materials, new processes, and/or new process sequence integration schemes, since the entire substrate is nominally made the same using the same material(s), process(es), and process sequence integration scheme. Conventional full wafer uniform processing results in fewer data per substrate, longer times to accumulate a wide variety of data and higher costs associated with obtaining such data. As an example, traditional liquid chemical deposition processes are severely limited in that they typically coat an entire substrate surface with a liquid material. Thus, standard liquid application processes used throughout various steps in semiconductor processing lack the ability to perform combinatorial liquid material processing and deposition. As a result, the manufacture and analysis of a substrate region or structure treated with traditional liquid chemical application processes require relatively long processing times and increased processing steps. Additionally, the inability to simultaneously apply liquid materials at multiple regions and multiple materials on a single substrate surface inhibits the ability for comparative analysis between the various regions of a given substrate and/or substrates.

BRIEF DESCRIPTION OF THE DRAWINGS

The numerous advantages of the disclosure may be better understood by those skilled in the art by reference to the accompanying figures in which:

FIG. 1D is a simplified schematic view of a system for combinatorial non-contact wet processing, in accordance with one embodiment of the present invention.

FIG. 1E is a block diagram illustrating an implementation of combinatorial processing and evaluation.

FIG. 5 is a flow chart illustrating a method for combinatorial non-contact wet processing.

DETAILED DESCRIPTION OF THE INVENTION

Figure 1A:
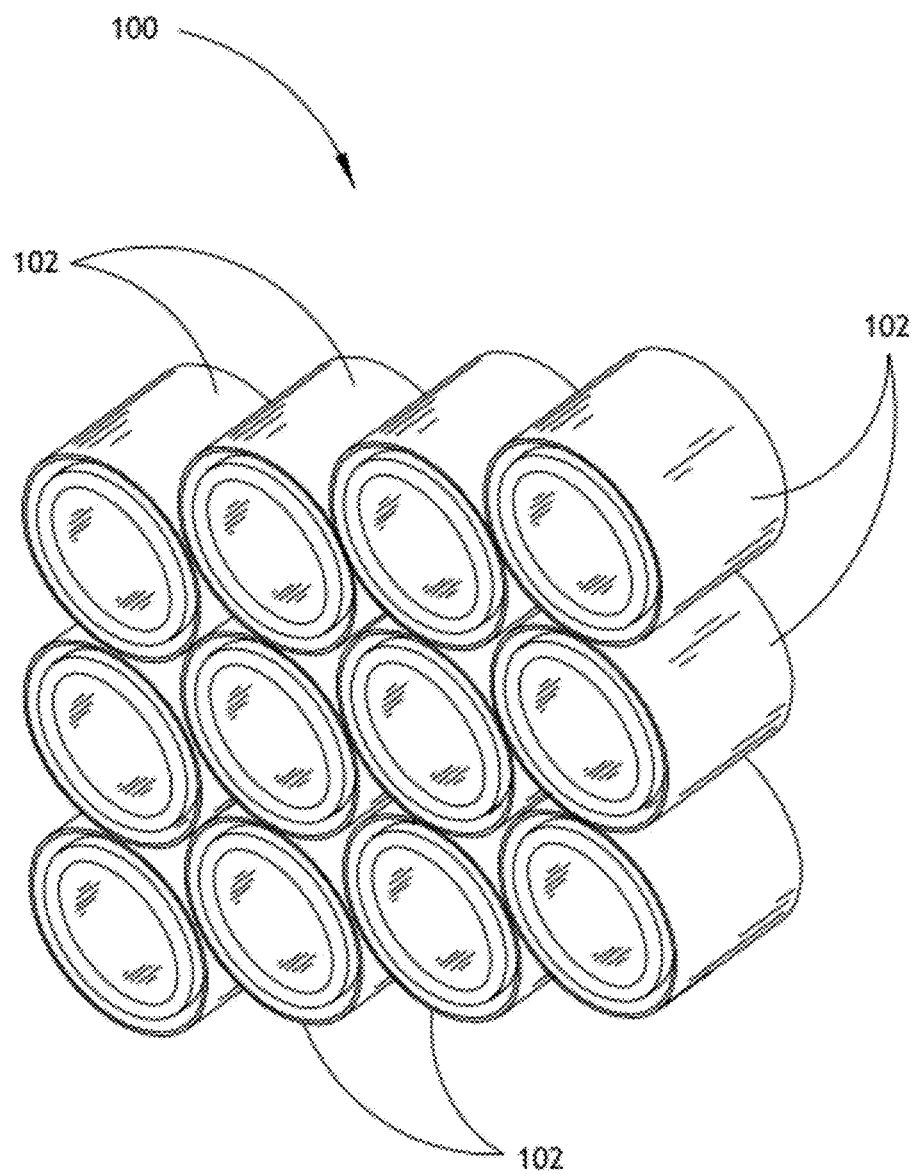
FIG. 1A is a glancing angle schematic view of a system for combinatorial non-contact wet processing, in accordance with one embodiment of the present invention.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Referring generally to FIG. 1A through 4B, a system 100 for combinatorial non-contact wet processing is described in accordance with the present disclosure. The system 100 for combinatorial non-contact wet processing may include multiple reaction cells 102 each of which are capable of isolating a selected region 108 of a substrate 114. The isolating non-contact reaction cells 102 may be utilized to apply a selected liquid material onto the selected isolated regions 108 of the surface of a substrate 114. The two or more isolating reaction cells 102 may be used combinatorially in order to deposit materials simultaneously or sequentially at two or more isolated substrate regions 108. The system 100 for combinatorial non-contact wet processing provides for the application of multiple materials in discretized regions 108 at selected positions on the surface of a given substrate 114, such as a silicon wafer. Moreover, the system 100 for combinatorial non-contact wet processing allows for the application of liquid materials to a substrate surface without the added contamination associated to a mechanically attached reaction cell. Non-contact spray deposition is particularly advantageous in settings where the pristine nature of an underlying substrate is critical.

The embodiments described herein enable the application of combinatorial techniques to deposition process sequence integration in order to arrive at a globally optimal sequence of semiconductor manufacturing operations by considering interaction effects between the unit manufacturing operations on multiple regions of a substrate concurrently. Specifically, multiple process conditions may be concurrently employed to effect such unit manufacturing operations, as well as material characteristics of components utilized within the unit manufacturing operations, thereby minimizing the time required to conduct the multiple operations. A global optimum sequence order can also be derived and as part of this technique, the unit processes, unit process parameters and materials used in the unit process operations of the optimum sequence order are also considered.

The embodiments described herein are capable of analyzing a portion or sub-set of the overall deposition process sequence used to manufacture a semiconductor device. The process sequence may be one used in the manufacture of integrated circuits (IC) semiconductor devices, data storage devices, photovoltaic devices, and the like. Once the subset of the process sequence is identified for analysis, combinatorial process sequence integration testing is performed to optimize the materials, unit processes and process sequence for that portion of the overall process identified. During the processing of some embodiments described herein, the deposition may be used to form, modify, or complete structures already formed on the substrate, which structures are equivalent to the structures formed during manufacturing of substrates for production. For example, structures on semiconductor substrates may include, but are not limited to, trenches, vias, interconnect lines, capping layers, masking layers, diodes, memory elements, gate stacks, transistors, or any other series of layers or unit processes that create a structure found on semiconductor chips. The material, unit process and process sequence variations may also be used to create layers and/or unique material interfaces without creating all or part of an intended structure, which allows more basic research into properties of the resulting materials as opposed to the structures or devices created through the process steps. While the combinatorial processing varies certain materials, unit processes, or process sequences, the composition or thickness of the layers or structures or the action of the unit process is preferably substantially uniform within each region, but can vary from region to region per the combinatorial experimentation.

The result is a series of regions on the substrate that contain structures or results of unit process sequences that have been uniformly applied within that region and, as applicable, across different regions through the creation of an array of differently processed regions due to the design of experiment. This process uniformity allows comparison of the properties within and across the different regions such that the variations in test results are due to the varied parameter (e.g., materials, unit processes, unit process parameters, or process sequences) and not the lack of process uniformity. However, non-uniform processing of regions can also be used for certain experiments of types of screening. Namely, gradient processing or regional processing having non-uniformity outside of manufacturing specifications may be used in certain situations.

The term "combinatorial processing" generally refers to techniques of differentially processing multiple regions of a substrate. Combinatorial processing can be used to produce and evaluate different materials, chemicals, processes, and techniques related to semiconductor fabrication as well as build structures or determine how the above coat, fill, or interact with existing structures. Combinatorial processing varies materials, unit processes and/or process sequences across multiple regions on a substrate.

FIGS. 1A through 1D illustrate schematic views of a system 100 for combinatorial non-contact wet processing in accordance with exemplary embodiments of the present invention. The system 100 for combinatorial non-contact wet processing may include two or more reaction cells 102 configured to isolate two or more selected regions 108 of a substrate 114. As shown in FIG. 1A, the reaction cells 104 may be arranged in an array (e.g., hexagonal array), allowing for the precise control of the location of the isolated application regions 108 on a corresponding substrate 114 surface. Moreover, the system 100 may include one or more liquid material sources 106 suitable for supplying a liquid material 107 to the reaction cells 102. For instance, one or more liquid material sources 106 may be in fluidic communication with one or more reaction cells 102 of the system 100, allowing for the transportation of one or more liquid materials 106 from the liquid material source 107 to the reaction cells 102.

Figure 1B:
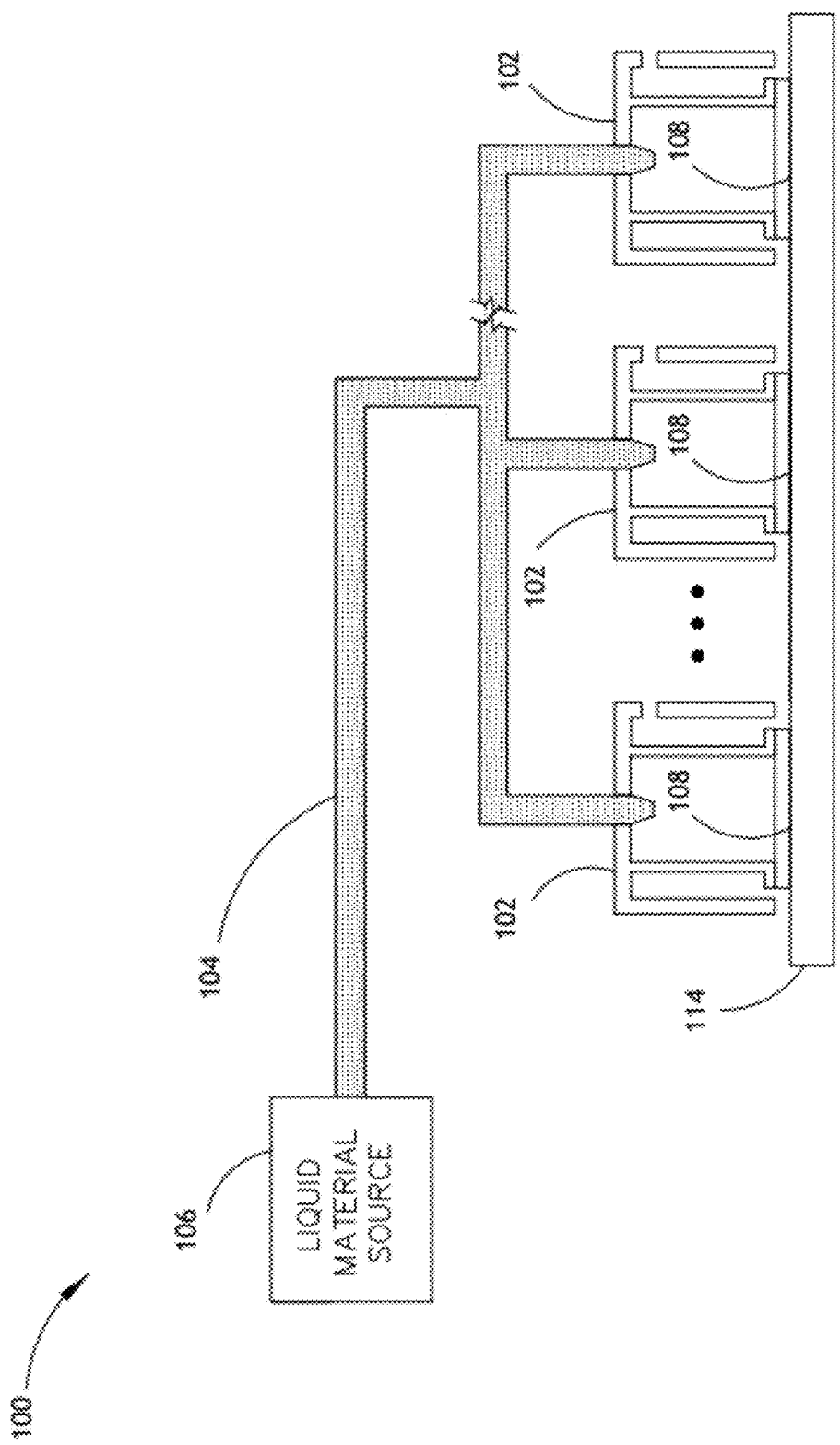
FIG. 1B is a simplified schematic view of a system for combinatorial non-contact wet processing, in accordance with one embodiment of the present invention.

In one embodiment, illustrated in FIG. 1B, the system 100 may include a single liquid material source 106 fluidically coupled to two or more reaction cells 102. For example, a single liquid material 107 may be transported from a liquid material source 106 to two or more reaction cells 104 via a network of liquid source-cell conduits 105. For instance, a first portion of the liquid material 106 may be transported to a first non-contact reaction cell 102 configured to isolate a first region 108 of the substrate 114, a second portion of the liquid material 106 may be transported to a second non-contact reaction cell 102 configured to isolate a second region 108 of the substrate 114, and an Nth portion of the liquid material 106 may be transported to an Nth non-contact reaction cell 102 configured to isolate an Nth region 108 of the substrate 114.

Figure 1C:
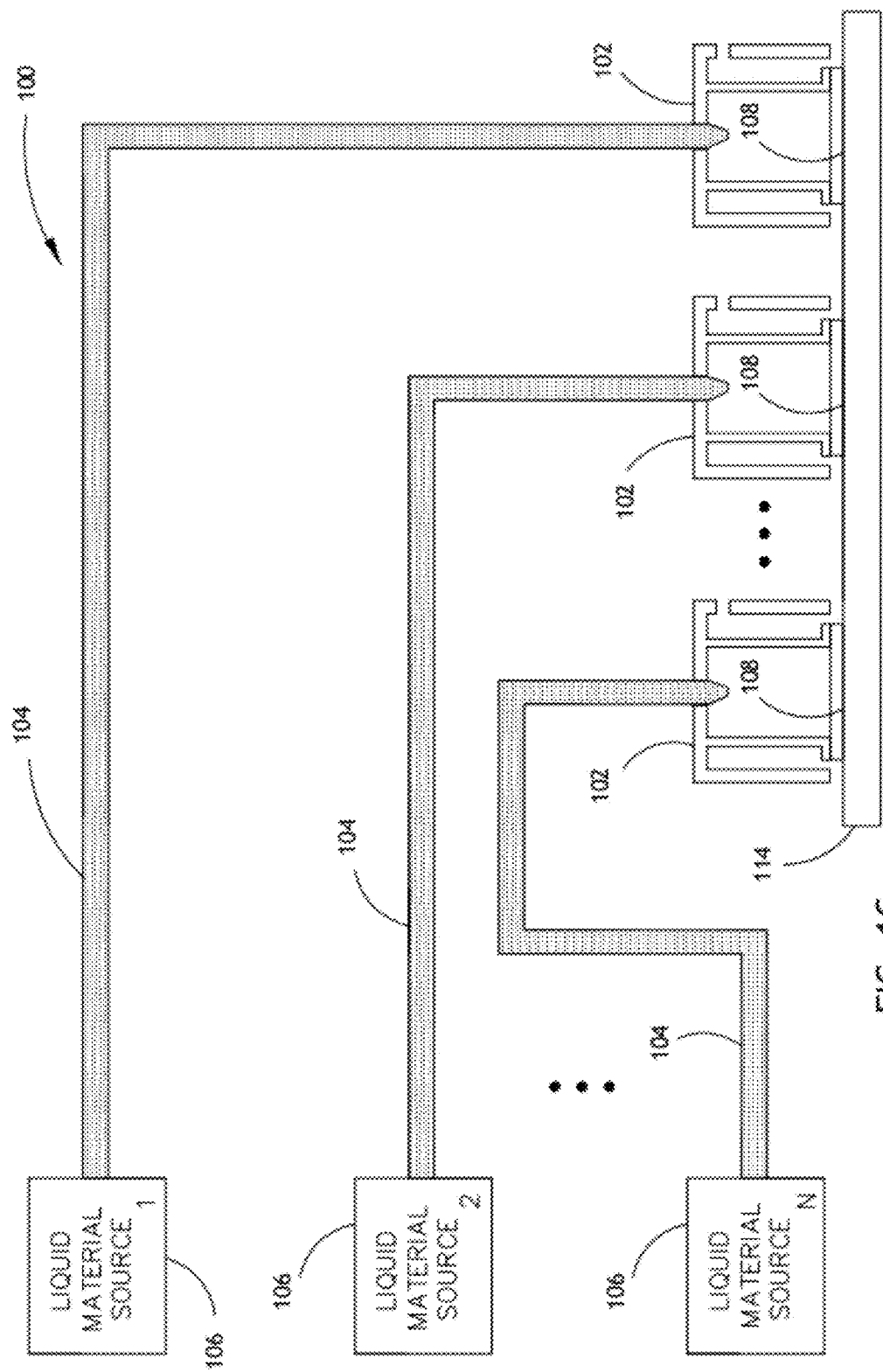
FIG. 1C is a simplified schematic view of a system for combinatorial non-contact wet processing, in accordance with one embodiment of the present invention.

In another embodiment, illustrated in FIG. 1C, the system 100 may include two or more liquid sources 106, wherein each liquid source 106 is fluidically coupled to a reaction cell 102. For example, a first liquid material source 106 may be fluidically coupled to a first reaction cell 102, a second liquid material source 106 may be fluidically coupled to a second reaction cell 102, and up to an including an Nth liquid material source 106 may fluidically coupled to an Nth reaction cell 102. A portion of the first liquid material 107 may then be transported from the first liquid material source 106 to a first reaction cell 102. A portion of the second liquid material 107 may then be transported from the second liquid material source 106 to a second reaction cell 102. A portion of the Nth liquid material 107 may then be transported from the Nth liquid material source 106 to the Nth reaction cell 102. For instance, the portion of the first liquid material 107 may be transported to a first reaction cell 102 configured to isolate a first region 108 of the substrate 114, the portion of the second liquid material 107 may be transported to a second reaction cell 102 configured to isolate a second region 108 of the substrate 114, and the portion of the Nth liquid material 107 may be transported to an Nth reaction cell 102 configured to isolate an Nth region 108 of the substrate 114. It should be noted that the first, second, and up to and including the Nth liquid materials 107 may be comprised of the same or different liquid materials.

In another embodiment, illustrated in FIG. 1D, the system 100 may include two or more liquid sources 106, wherein the liquid sources 106 are configured to deliver two or more liquid materials 107 to a single reaction cell 102. For instance, a portion of the first liquid material 107, a portion of the second liquid material 107, and up to and including a portion of an Nth liquid material 107 may be intermixed. For instance, a first liquid material 107, provided from a first liquid source 106, and second liquid material 107, from a second liquid source 106, may be mixed within a source-cell conduit 105 while the liquids are transported to one or more reaction cells 102. In another instance, a first liquid material 107, provided from a first liquid source 106, and second liquid material 107, from a second liquid source 106, may be mixed in an associated mixing chamber. The mixed liquid material may then be supplied to one or more reaction cells 102 as described in the present disclosure. The preceding description should not be interpreted as a limitation but rather merely an illustration of combinatorial processing techniques which may be implemented with the presently disclosed system and methods as it is contemplated that a variety of implementations may be more or less suitable in different contexts.

FIG. 1E is a block diagram 140 illustrating an implementation of combinatorial processing and evaluation. The schematic diagram 140 illustrates that the relative number of combinatorial processes run with a group of substrates decreases as certain materials and/or processes are selected. Generally, combinatorial processing includes performing a large number of processes and materials choices during a first screen, selecting promising candidates from those processes, performing the selected processing during a second screen, selecting promising candidates from the second screen, and so on. In addition, feedback from later stages to earlier stages can be used to refine the success criteria and provide better screening results.

For example, thousands of materials are evaluated during a materials discovery stage 142. Materials discovery stage 142 is also known as a primary screening stage performed using primary screening techniques. Primary screening techniques may include dividing wafers into regions and depositing materials using varied processes. The materials are then evaluated, and promising candidates are advanced to the secondary screening stage (i.e., the materials and process development stage 144). Evaluation of the materials is performed using metrology tools such as physical and electronic testers and imaging tools.

The materials and process development stage 144 may evaluate hundreds of materials (i.e., a magnitude smaller than the primary stage) and may focus on the processes used to deposit or develop those materials. Promising materials and processes are again selected, and advanced to the tertiary screening stage (i.e., the process integration stage 146), where tens of materials and/or processes and combinations are evaluated. The tertiary screening stage, or process integration stage 146, may focus on integrating the selected processes and materials with other processes and materials into structures.

The most promising materials and processes from the tertiary screening stage are advanced to the device qualification stage 148. In the device qualification stage 148, the materials and processes selected are evaluated for high volume manufacturing, which normally is conducted on full wafers within production tools, but need not be conducted in such a manner. The results are evaluated to determine the efficacy of the selected materials, processes, and integration. If successful, the use of the screened materials and processes can proceed to the manufacturing stage 150.

The schematic diagram 140 represents an example of various techniques that may be used to evaluate and select materials, processes, and integration for the development of semiconductor devices. The descriptions of primary, secondary, etc. screening and the various stages 142-150 are arbitrary and the stages may overlap, occur out of sequence, be described and be performed in many other ways.

While the preceding description is directed at the implementation of multiple reaction cells 102 in accordance with the present invention, the following description will, in part, describe aspects of a single reaction cell assembly 101. It is contemplated that the following description of components and implementations within the context of a single reaction cell assembly 101 should be interpreted to extend to the multiple reaction cell configuration of the preceding description.

Figure 1F:
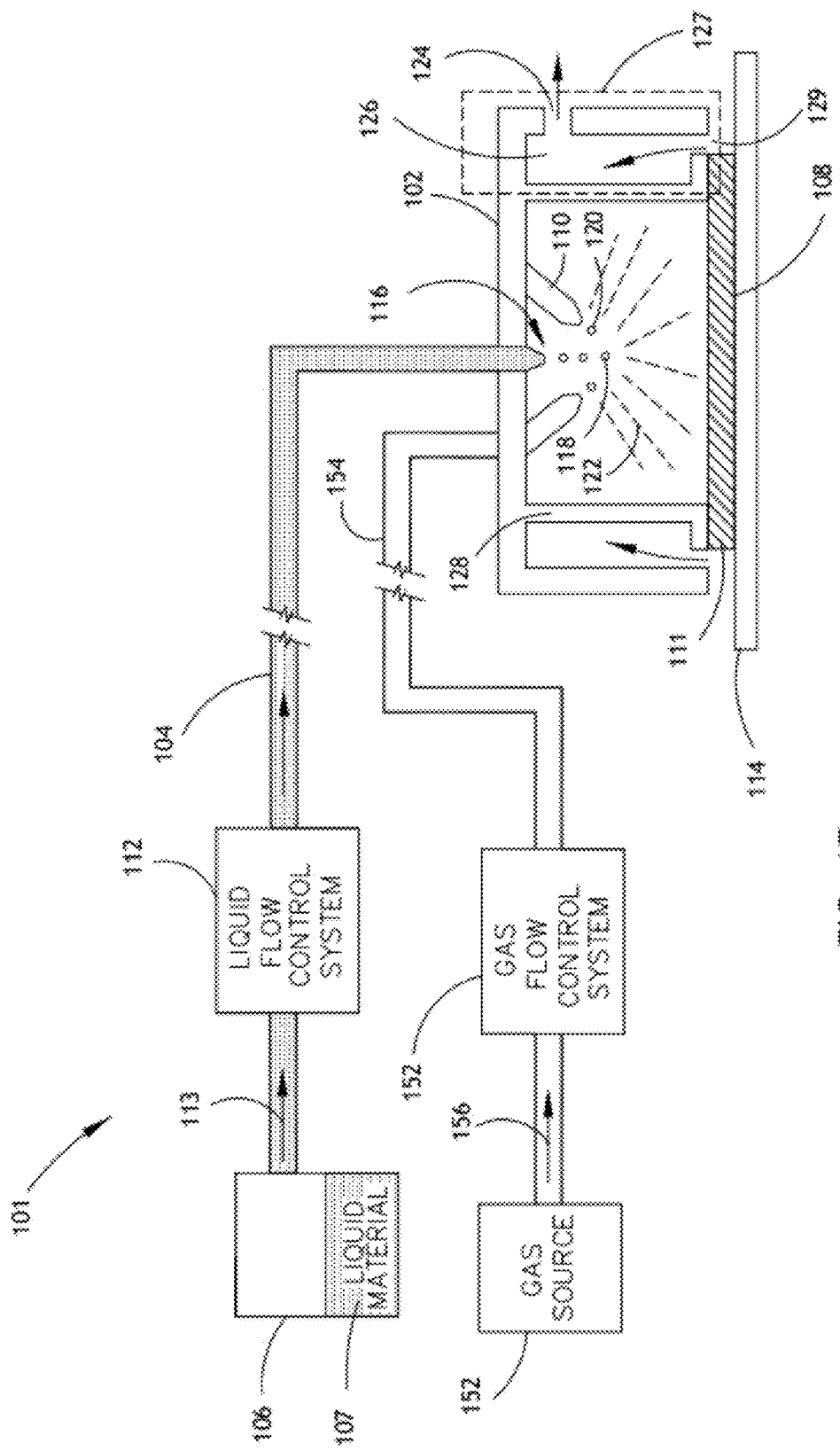
FIG. 1F is a simplified schematic view of a reaction cell assembly of the system for combinatorial non-contact wet processing, in accordance with one embodiment of the present invention.

FIG. 1F illustrates a partial cross-sectional schematic view of a single reaction cell assembly 101 of the system 100 for combinatorial non-contact wet processing in accordance with an exemplary embodiment of the present invention. The single assembly 101 of the system 100 may include a liquid material source 106 configured to supply a selected amount of a liquid material 107 to a non-contact reaction cell 102. The liquid material source 106 may be placed in fluidic communication with the non-contact reaction cell 102 utilizing a source-cell conduit 104. The liquid material 107 may be transported from the liquid source 106 to an inlet 116 of the non-contact reaction cell 102 through the source-cell conduit 104.

In addition, the single assembly 101 of the system 100 may include a plurality of gas jets 110 disposed within the interior 132 of the non-contact reaction cell 102. The gas jets 110 may be used to atomize a portion of the liquid material 107 transported from the liquid material source 106 to the inlet 116 of the reaction cell via the source-cell conduit 104 into a spray of liquid material 122. For instance, one or more gas streams 120 emanating from one or more gas jets 110 may be impinged onto one or more liquid droplets 118 which enter the interior 132 of the deposit cell 102 through the cell inlet 116.

Moreover, the non-contact reaction cell 102 of the assembly 101 may be configured to direct the spray of the liquid material 107 from the inlet 116 of the reaction cell 102 onto an isolated region 108 of the surface of a substrate 114. The reaction cell 102 may be situated such that the non-contact reaction cell 102 is in close proximity to but not in physical contact with the surface of the substrate, allowing for the deposition of spray of liquid material 122 onto an isolated selected region 108 of the substrate 114. For instance, the reaction cell 102 may be positioned at a selected distance above the surface of the substrate 114, wherein the selected distance is a function of both the material properties of the implemented liquid material and the substrate surface. After atomization by the gas jets 110, the droplets of the spray of liquid material 122 may accelerate (e.g., via gravitational forces) from the top of the reaction cell 102 to the surface of the substrate 114.

Furthermore, the single assembly 101 of the system 100 may include one or more vacuum elements 127 disposed along an edge of the non-contact reaction cell 102. The vacuum elements 127 may facilitate the flow of the liquid spray 122 toward the surface of the substrate 114. In addition, the vacuum elements 127 may act to contain the deposited liquid material 111 within a selected region 108 of the substrate 114 by evacuating portions of the liquid material 111 that migrate toward the edge of the region 108 demarked by the vacuum element(s) 127.

In some embodiments, the region 108 may include one region and/or a series of regular or periodic regions preformed on the substrate. The region may have any convenient shape (e.g., circular shape, rectangular shape, elliptical shape, wedge-shaped, or the like). In the semiconductor field, a region may include, but is not limited to, a test structure, a single die, a multiple die, a portion of a die, a defined portion of a substrate, or an undefined area of a blanket substrate, which is defined through the processing.

In some embodiments, the system 100 for combinatorial non-contact wet processing may include one or more liquid flow control systems 112. A liquid flow control system 112 may be utilized to control the flow of a liquid material 107 from a liquid source 106 to one or more non-contact reaction cells 102 of the system 100. For example, in a single assembly 101 of the system 100, a liquid flow control system 112 may control the flow of a liquid material 107 from a liquid material source 106 to an inlet 116 of the non-contact reaction cell 102 through a source-cell conduit 104, such as a plastic tubing (e.g., polyvinyl chloride tubing or polyethylene tubing) conduit or a metal tubing conduit (e.g., aluminum tubing, copper tubing, or brass tubing).

In additional embodiments, one or more liquid flow control systems 112 may include one or more actuated valves configured to control the flow of a liquid material 107 from a liquid source 106 to one or more reaction cells 102. For example, an actuated valve of the liquid control system 112 may be opened allowing a liquid material 107 to flow from a liquid material source 106 (e.g., pressurize liquid material source) to a liquid inlet of a reaction cell 102. By way of another example, an actuated valve of the liquid control system 112 may be closed, stopping the liquid material 107 from flowing from a pressurized liquid material source 106 to the liquid inlet of a reaction cell 102.

In another embodiment, one or more liquid flow control systems 112 may include one or more pumps. For example, a pump of the liquid control system 112 may be used to transport the liquid material 107 from the liquid material source 106 to the liquid inlet of the reaction cell 102. For instance, the pump may include a liquid pump used to pump the liquid material 107 from the liquid material source 106 to a liquid inlet of the reaction cell 102. In another instance, the pump may include a gas pump used to pressurize a sealed container of the liquid material 107.

In a further embodiment, one or more liquid control systems 112 may include one or more computer control systems. For example, a computer control system of the liquid control system 112 may be used to control one or more valves or one or more pumps of a liquid control system 112. Moreover, it is further contemplated that a computer control system may include preprogrammed software suitable for providing instructions to the computer system output, which in turn signals the one or more actuated valves or pumps of a liquid control system 112. Additionally, the computer control system 112 may be responsive to an operator input, wherein the computer control system in response to the operator input provides instructions to the computer system output, which in turn signals the one or more actuated valves or pumps of the liquid control system 112. Further, it is also contemplated that the computer control system 112 may be responsive to a signal transmitted by another control system (e.g., a global control system) of the system 100, wherein the computer control system of the liquid control system 112, responsive to a signal from another control system, provides instructions to the computer system output, which in turn signals the one or more actuated valves or pumps of the liquid control system 112.

It is further contemplated that a global liquid control system may be used to control individual liquid flows in the single assemblies 101 of the system 100. For example, a global liquid control system may be utilized to control a first liquid flow from a first liquid material source 106 to a first reaction cell 102, a second liquid flow from a second liquid material source 106 to a second reaction cell 102, and a up to and including an Nth liquid flow from an Nth liquid material source 106 to an Nth reaction cell 102.

The preceding description of the one or more liquid control systems 112 should not be interpreted as a limitation but rather merely an illustration as it is contemplated that a variety of implementations may be more or less suitable in different contexts.

In some embodiments, the system 100 for combinatorial non-contact wet processing may include one or more gas flow control systems 152. A gas flow control system 152 may be utilized to control the rate at which a gas is supplied from a gas source 154 to the gas jets 110 disposed in a non-contact reaction cell 102. For example, in a single assembly 101 of the system 100, one or more gas flow control systems 152 may include one or more actuated valves configured to regulate the gas flow 156 between a gas source 154 and gas jet 110. The regulation of gas flow 156 between the gas source 154 and the gas jet 110 allows for control of the atomization process of the liquid material 106 in the reaction cell 102. For example, an actuated gas valve of the gas flow control system 152 may be adjusted in order to adjust the flow rate of the gas stream 156 flowing from the gas source 154 to the gas jets 110 and in turn regulating the conversion of the liquid material 106 to a liquid spray material 122.

In other embodiments, one or more gas flow control systems 152 of the system 100 for combinatorial non-contact wet processing may include one or more electronic mass flow control systems. For example, a mass flow control system of the gas flow control system 152 may be adjusted in order to adjust the flow rate of the gas stream 156 flowing from the gas source 154 to the gas jets 110 disposed in a non-contact reaction cell 102.

In some embodiments, one or more gas flow control systems 152 of the system 100 for combinatorial non-contact wet processing may include one or more actuated orifices. For example, an actuated orifice 129 of a gas flow control system 152 may be utilized to adjust the flow rate of the gas stream 156 flowing from the gas source 154 to the gas jets 110 disposed in a non-contact reaction cell 102.

In further embodiments, one or more gas flow control systems 152 may include a computer control system configured to control the actuated valves of a gas flow control system 152. For instance, in response to an input instruction from an operator, the computer control system may transmit an electronic signal to one or more actuated valves or a mass flow control system configured to respond (e.g., open or close) to an electronic signal. In another instance, a preprogrammed computer control system may maintain or establish a selected gas flow rate by adjusting one or more actuated valves or one or more mass flow control systems located between the gas source 154 and the gas jets 110 disposed in a non-contact reaction cell 102.

Further, one or more gas flow control systems 152 may be controlled by the liquid flow control system 112. For instance, the computer control system of a liquid flow control system 112 may transmit instruction signals to one or gas flow control system 152 in order to regulate the flow rate of a gas being transported from a gas source 154 to the gas jets 110 disposed in a non-contact reaction cell 102.

It is further contemplated that the computer control system of a gas flow control system 152 may be responsive to a global control system, which is configured to control the various subsystems (e.g., liquid control system(s) 112, gas flow control system(s) 152, or vacuum element systems(s) 127) of the system 100. Moreover, it is further recognized that the computer control system of one or more liquid flow control systems 112 and the computer control system of one or more of the gas flow control systems 152 may in fact be subsystems of a single global computer control system, wherein the computer control system of the liquid flow control system 112 and the computer control system of the gas flow control system 152 are modules of the global computer control system.

It is further contemplated that a global gas flow control system may be used to control individual gas flow rates in the single assemblies 101 of the system 100. For example, a global gas flow control system may be utilized to control a first gas flow from a first gas source 154 to the gas jets 110 of a first reaction cell 104, a second gas flow from a second gas source 154 to a second reaction cell 102, and a up to and including an Nth gas flow from an Nth gas source to an Nth reaction cell 102. The preceding description of the one or more gas flow control systems 152 should not be interpreted as a limitation but rather merely an illustration as it is contemplated that a variety of implementations may be more or less suitable in different contexts.

In some embodiments, one or more source-cell conduits 104 of the system 100 may include a laminar flow element. For example, a source-cell conduit 104 may include a straight pipe section configured to produce substantially laminar flow in the liquid flow 113 between the liquid source 106 and the reaction cell 102. It should be appreciated by those skilled in the art that the non-turbulent laminar flow that may occur in a source-cell conduit 104 may allow for more precise control of application conditions as the fluid movement of the liquid flow 113 is more readily predicted and controlled.

It is further contemplated that in the context of the system 100 for combinatorial non-contact wet processing multiple source-cell conduits 104 may be implemented. For example, as shown in FIG. 1B, the conduits 104 may be used to fluidically couple a single liquid material source 106 to multiple reaction cells 102. In another example, as shown in FIG. 1C, a conduit 104 may be used to couple a single liquid material source 106 to a single reaction cell 102. Further, as shown in FIG. 1D, a network of conduits 104 may be implemented to fluidically couple emerging liquid flows 113 from multiple liquid material sources 106, allowing the combined intermixed liquid flow 113 to be transported to the individual reaction cells 102 of the system 100.

In some embodiments, the material used to fabricate one or more reaction cells 102 of the system 100 for combinatorial non-contact wet processing may include, but is not limited to, a metal material or a plastic material. For example, a reaction cell 102 of the system 100 for combinatorial non-contact wet processing may include an aluminum reaction cell. By way of another example, a reaction cell 102 of the system 100 for combinatorial non-contact wet processing may include a Teflon reaction cell. In another example, a reaction cell 102 of the system 100 for combinatorial non-contact wet processing may include an acrylic reaction cell. An acrylic reaction cell is particularly advantageous when optical monitoring of the spray deposition process or subsequent treatment processes are required. Further, ultraviolet ("UV") transparent acrylic may be implemented in situations where the deposited liquid material 111 of liquid material spray 122 requires further UV treatment (e.g., UV curing).

Figure 4A:
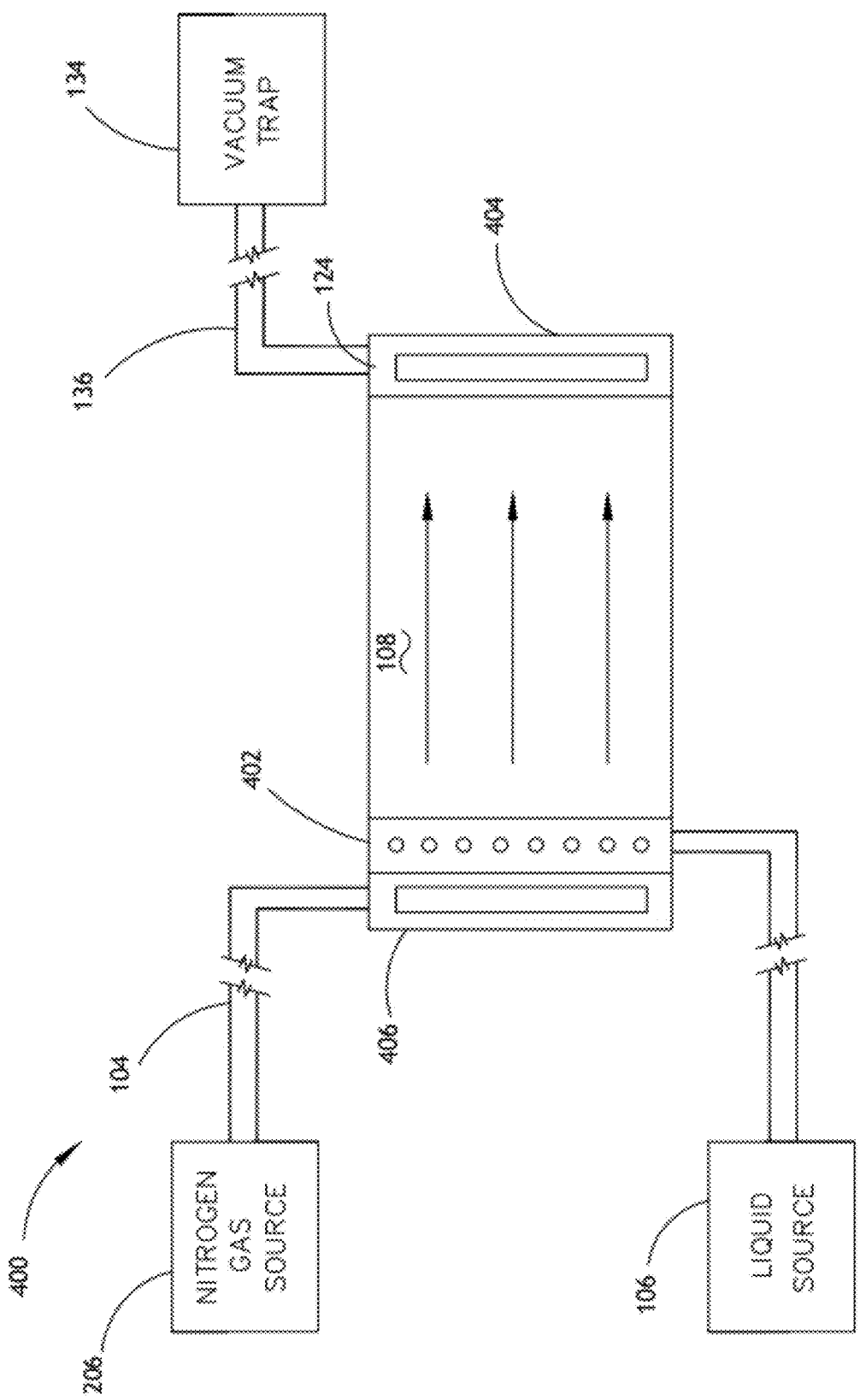
FIG. 4A is a simplified schematic view of a horizontal reaction cell assembly of the system for combinatorial non-contact wet processing, in accordance with one embodiment of the present invention.
Figure 4B:
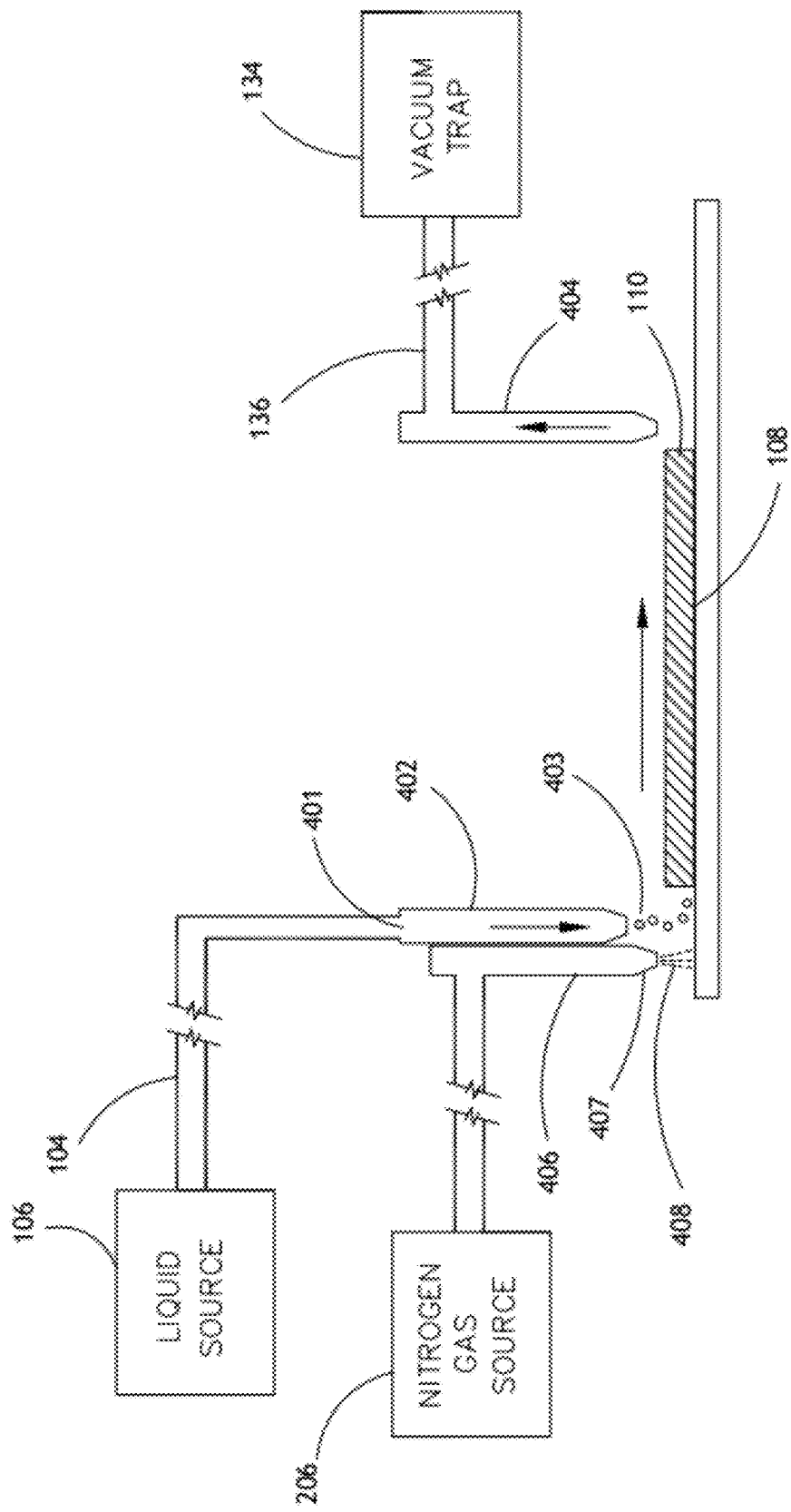
FIG. 4B is a simplified schematic view of a horizontal reaction cell assembly of the system for combinatorial non-contact wet processing, in accordance with one embodiment of the present invention.

A variety of reaction cell 102 shapes may be implemented in accordance with the present invention. For example, the reaction cell 102 may include a cylindrical shaped reaction cell, as illustrated in FIGS. 1A through 1F. In another example, the reaction cell 102 may include a rectangular shaped reaction cell, as illustrated in FIGS. 4A and 4B. In a general sense, the reaction cell 102 may be of any convenient shape (e.g., cylinder, rectangular cuboid, a cone, a pyramid, and the like) and may depend on the specifics of its implementation.

A variety of substrates may be implemented in accordance with the present invention. For example, the substrate 114 may include, but is not limited to, a silicon substrate, a gallium arsenide substrate, glass, quartz, ruby or the like. The preceding lists of substrate materials should not be considered a limitation as there exists a variety of substrate materials suitable for implementation in accordance with the present invention. In a general sense, a substrate should be interpreted as any object with which a thin film material may be deposited utilizing the present invention.

Further, the substrate 114 may be a conventional round 200 millimeter, 300 millimeter or any other larger or smaller substrate/wafer size. In other embodiments, substrate 114 may be a square, rectangular, or other shaped substrate. One skilled in the art will appreciate that substrate 114 may be a blanket substrate, a coupon (e.g., partial wafer), or even a patterned substrate having predefined regions. In another embodiment, substrate 114 may have regions defined through the processing described herein.

Figure 1G:
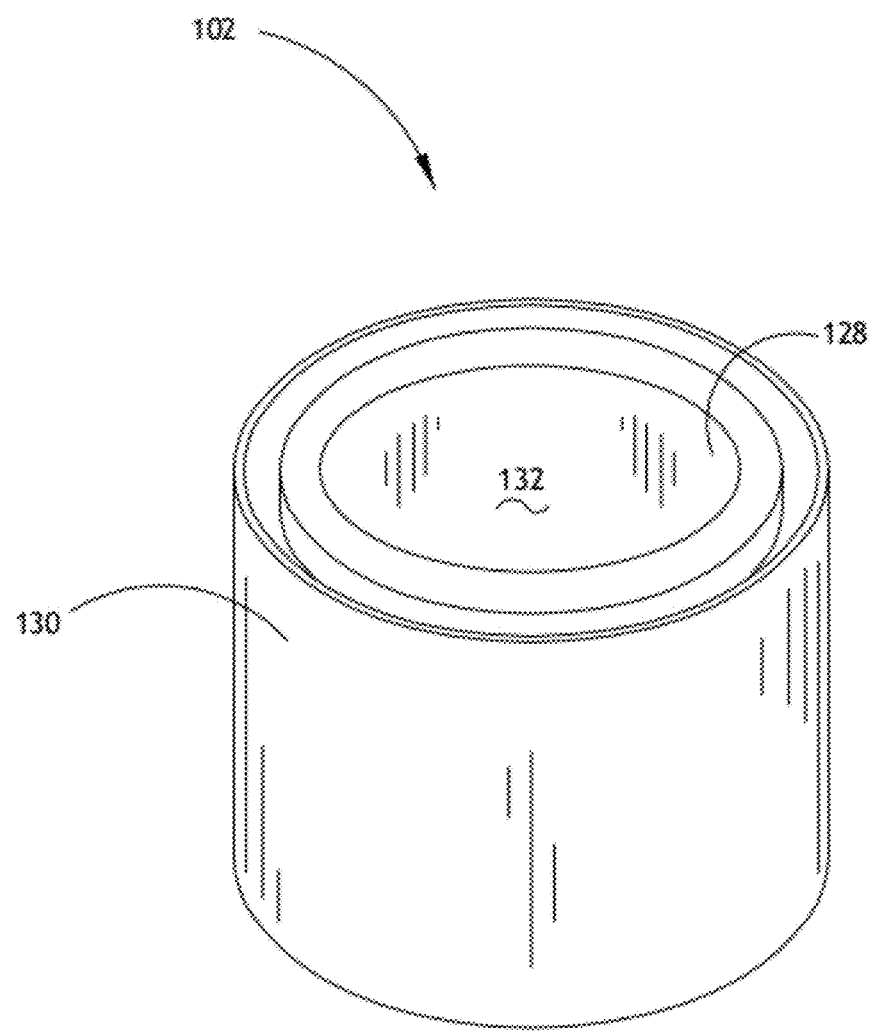
FIG. 1G is a schematic view of a single reaction cell of the system for combinatorial non-contact wet processing, in accordance with one embodiment of the present invention.
Figure 1H:
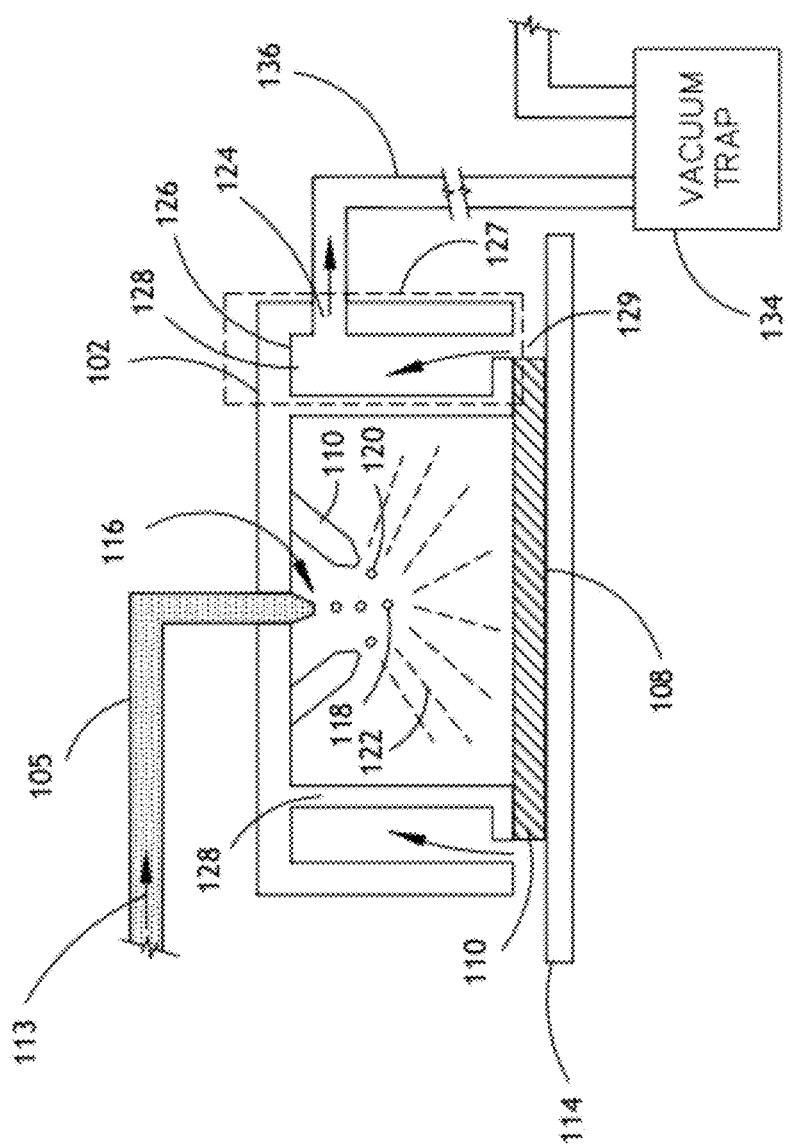
FIG. 1H is a simplified schematic view of a single reaction cell of the system for combinatorial non-contact wet processing illustrating a vacuum element, in accordance with one embodiment of the present invention.

Referring now to FIG. 1H, one or more vacuum elements 127 of the system 100 may be fluidically coupled to a vacuum trap 134. For example, a vacuum element 127 of a reaction cell 102 of a single assembly 101 of the system 100 may be utilized to transport coalesced liquid material 106 deposited on the substrate 114 from the interior 132 of the reaction cell 102 to a vacuum trap 134. It should also be recognized that the pressure differential created by the vacuum trap 134 may also act to accelerate the spray of liquid material 122 from the inlet 116 of the reaction cell 102 to the substrate 114 surface.

In a further embodiment, a vacuum element 127 of a reaction cell 102 may include one or more exhaust ports 124 configured to allow for the evacuation of liquid material 107 from the inner region 132 of the reaction cell 102 to the external vacuum trap 134. For example, an exhaust port 124 may be located on the wall 128 of a reaction cell 102 and may be fluidically coupled to the vacuum trap 134 via a cell-trap conduit 136, such as plastic (e.g., polyethylene or polyvinyl chloride) tubing or metal (e.g., stainless steel, copper, aluminum, or brass) tubing.

Further, a vacuum element 127 of a reaction cell 102 may include one or more exhaust channels 126. For example, an exhaust channel 126 of a reaction cell 102 may be defined by a wall 128 located within the interior of a reaction cell 102 and extending from the top of the reaction cell 102 towards the bottom of the reaction cell 102. A vacuum element inlet 129 at the bottom of the reaction cell 102 allows liquid material 107 to pass from the surface of the substrate 114 to the exhaust channel 126 of the reaction cell 102. Moreover, the exhaust channel 126 acts to transport the liquid material 107 from the vacuum element inlet 129 to the exhaust port 124 of the reaction cell 102. It should be recognized that the preceding description pertaining to the vacuum element(s) 127 of a single assembly 101 of the system 100 for combinatorial non-contact wet processing should not be interpreted as a limitation but merely as an illustration as other exhaust system arrangements may be more or less suitable in different contexts.

In a further embodiment, a vacuum element 127 may include one or more actuated valves fluidically coupled to an exhaust port 124 of a reaction cell 102 and a vacuum trap 134. For instance, one or more actuated valves may be connected in series between the exhaust port 124 and the vacuum trap 134 along the cell-trap conduit 136.

In another embodiment, a vacuum element 127 may include one or more actuated orifices fluidically coupled to an exhaust port 124 of a reaction cell 102 and a vacuum trap 134. For instance, one or more actuated orifices (e.g., pressure activated orifice) may be connected in series between the exhaust port 124 and the vacuum trap 134 along the cell-trap conduit 136.

In a further embodiment, one or more vacuum elements 127 may include a computer control system configured to control the actuated valves or actuated orifices of the one or more vacuum elements 127. For instance, in response to an input instruction from an operator, the computer control system may transmit an electronic signal to one or more actuated valves or one or more orifices configured to respond to an electronic signal. In another instance, a preprogrammed computer control system may maintain or establish a selected liquid uptake rate by adjusting one or more actuated valves or one or more actuated orifices located between the exhaust port 124 and the vacuum trap 134. It is further contemplated that the computer control system may be responsive to a global control system, which is configured to control the various subsystems (e.g., liquid control system 112, gas flow control system 152, or vacuum elements 127) of the system 100.

In some embodiments, one or more vacuum elements 127 may include a ring shaped vacuum element. For example, as illustrated in FIGS. 1F through 1H, a circular shaped vacuum element may be disposed on the circumference of a cylindrically shaped reaction cell 102. In other embodiments, one or more vacuum elements 127 may include a bar shaped vacuum element. For example, as illustrated in FIGS. 4A and 4B, a bar shaped vacuum element may be disposed along one or more edges of a rectangular shaped reaction cell 102. The preceding description of the one or more vacuum elements 127 should not be interpreted as a limitation but rather merely an illustration as it is contemplated that a variety of implementations may be more or less suitable in different contexts. Moreover, the specific shape of a given vacuum element 127 may greatly depend on the geometry of the implement reaction cell 102.

Figure 2:
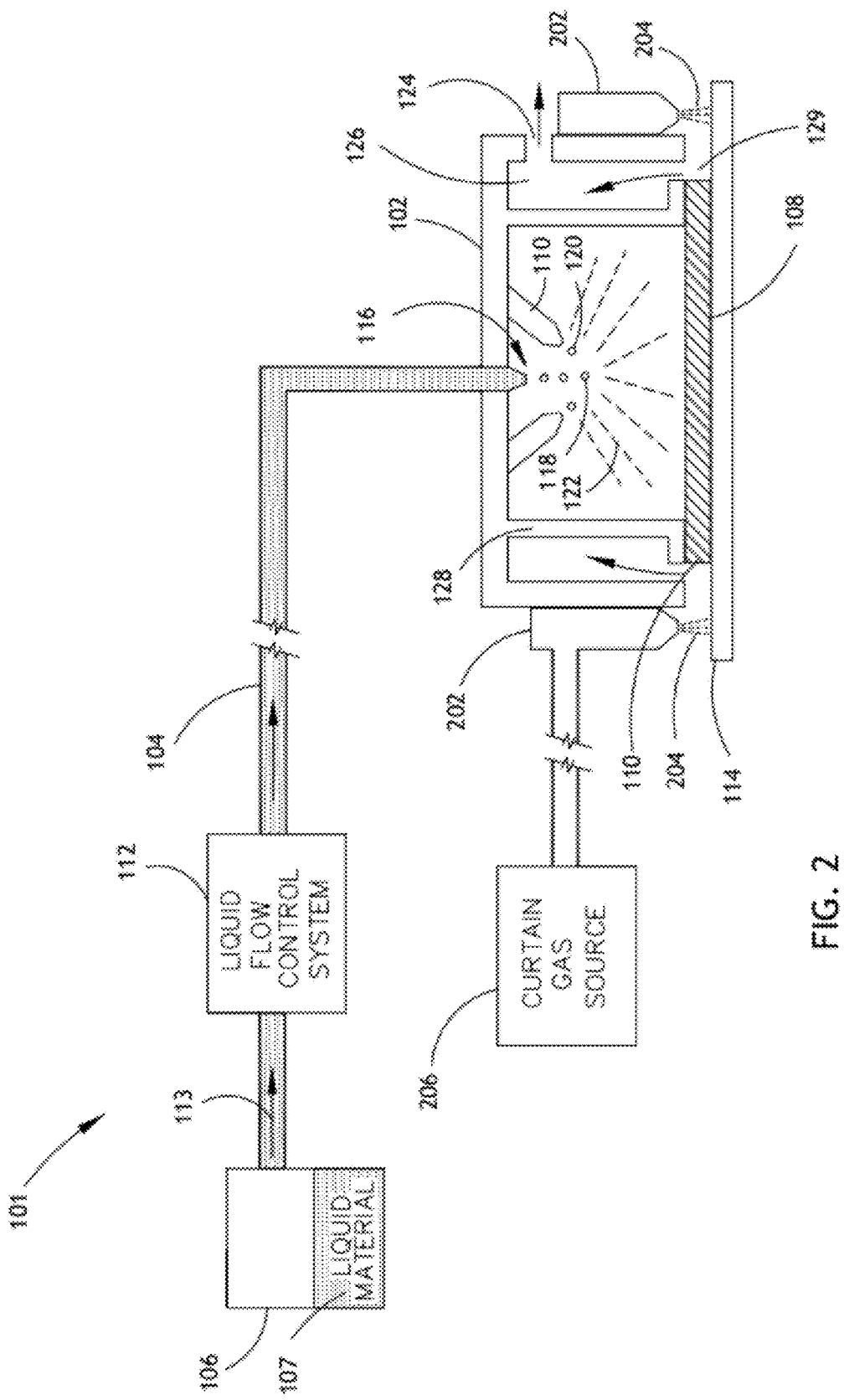
FIG. 2 is a simplified schematic view of a reaction cell assembly of the system for combinatorial non-contact wet processing illustrating a gas curtain element, in accordance with one embodiment of the present invention.

Referring now to FIG. 2, the system 100 for combinatorial non-contact wet processing may include one or more gas curtain elements 202 configured to contain the applied liquid material 107 within a selected region 108 of the substrate 114. For example, a gas curtain element 202 may flow a gas stream 204 at the periphery of a reaction cell 102 in order to contain the applied liquid material 107 within the selected region 108 of the substrate 114. For instance, a curtain gas source 206 may supply gas to a gas curtain element 202. The gas curtain element may then flow one or more gas streams 204 at the bottom edge of the reaction cell 102, directing the gas stream toward the vacuum element inlet 129, in order to contain the applied liquid material 107 within the selected region 108 of the surface of the substrate 114. It will be recognized by those skilled in the art that the requisite flow rate of the utilized gas curtain stream 204 will be a function of the cell-substrate distance, the type of liquid material 107, and the type of substrate surface.

In some embodiments, the curtain gas source may include an inert gas source. For example, the gas source may include a nitrogen gas source or an argon gas source. For instance, a nitrogen gas source 206 may supply gas to a gas curtain element 202. The gas curtain element may then flow one or more nitrogen gas streams 204 at the bottom edge of the reaction cell 102, directing the nitrogen gas stream toward the vacuum element inlet 129, in order to contain the deposited liquid material 107 within the selected region 108 of the surface of the substrate 114.

In some embodiments, a gas curtain element 202 may include a ring shaped gas curtain element. For example, as illustrated in FIG. 2, a circular shaped vacuum element may be disposed on the circumference of a cylindrically shaped reaction cell 102. In other embodiments, one or more gas curtain elements 202 may include a bar shaped gas curtain element 406. For example, as illustrated in FIGS. 4A and 4B, a bar shaped gas curtain element 406 may be disposed along one or more edges of a rectangular shaped reaction cell 102. The preceding description of the one or more gas curtain elements 202 should not be interpreted as a limitation but rather merely an illustration as it is contemplated that a variety of implementations may be more or less suitable in different contexts. Moreover, the specific shape of a given gas curtain element 202 may greatly depend on the geometry of the implemented reaction cell 102.

Figure 3A:
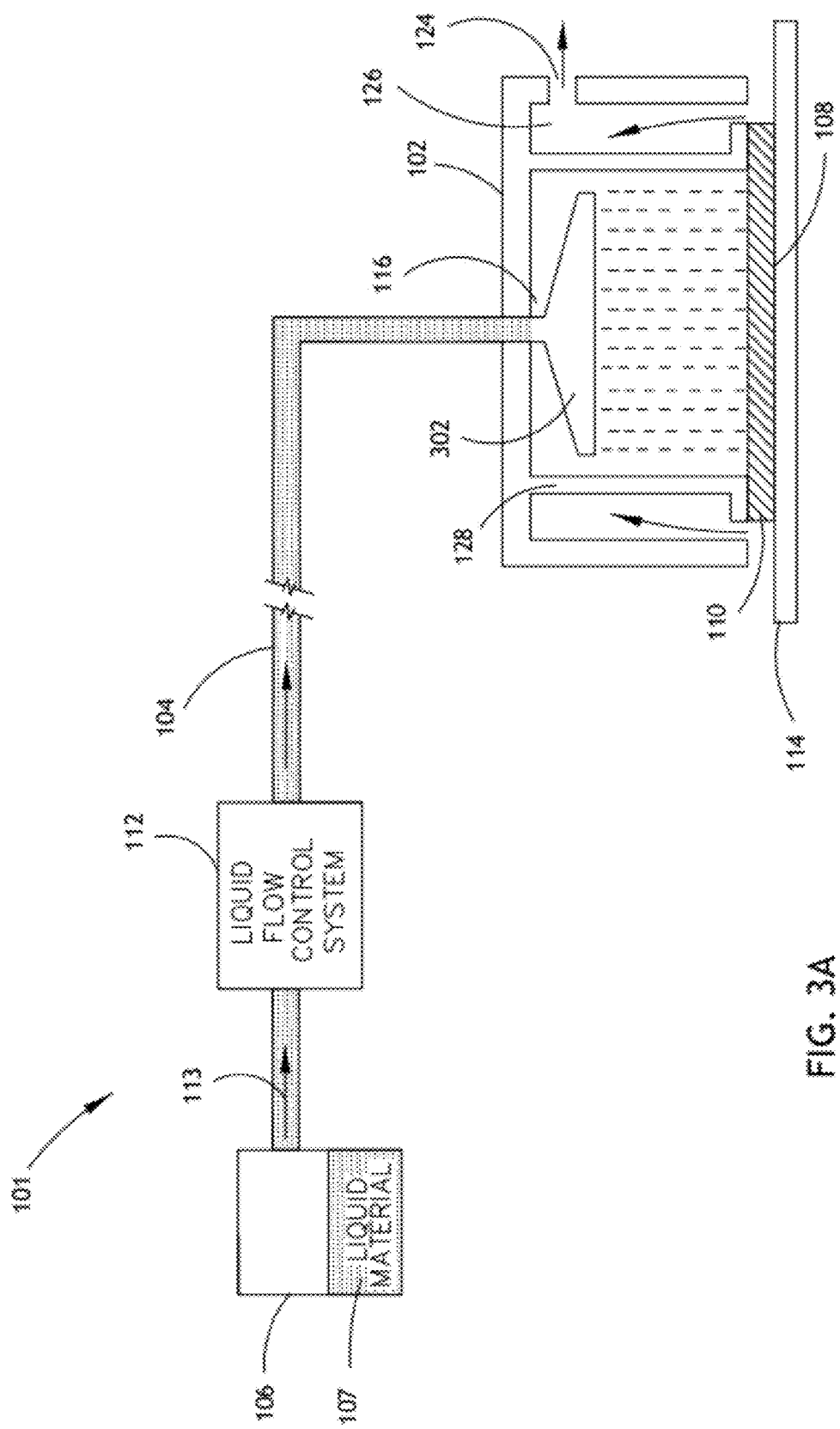
FIG. 3A is a simplified schematic view of a single reaction cell of the system for combinatorial non-contact wet processing illustrating a showerhead device, in accordance with one embodiment of the present invention.
Figure 3B:
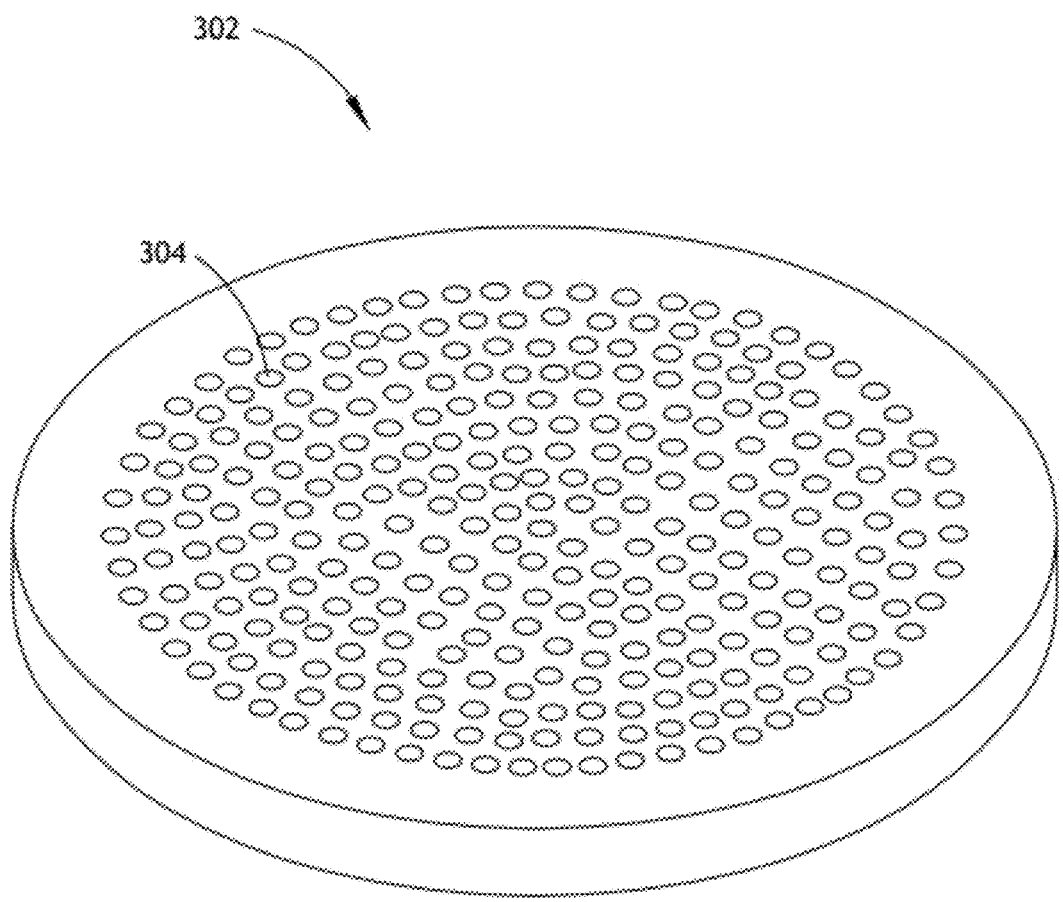
FIG. 3B is a glancing angle schematic view of a showerhead device, in accordance with one embodiment of the present invention.

Referring now to FIGS. 3A and 3B, the system 100 for combinatorial non-contact wet processing may include one or more showerhead devices 302 disposed within in the interior 132 of the non-contact reaction cell 102. A showerhead device 302 may be utilized to improve the uniform spatial distribution of the droplets of the spray of liquid material 122 by acting to diffuse the liquid material 107 into a spray of liquid material 122. For example, in a single assembly 101 of the system 100, a liquid material 107 may be transported from a liquid source 106 to a showerhead device 302 fluidically coupled to the inlet 116 of the reaction cell 102 and disposed within the reaction cell 102. The liquid material 107 may then pass through the openings 304 of the showerhead device 302, which act to diffuse the liquid material 107. After passing through the showerhead device 302, liquid spray 122 may then flow from the showerhead device 302 to the surface of a substrate 114. It is further recognized that the showerhead device may be implemented in conjunction with a plurality of gas jets 110, wherein the energy imparted by the gas stream of the gas jets act to further atomize the diffused liquid material.

In a further embodiment, a showerhead device 302 may be arranged substantially parallel to the substrate 114 surface and may be located within an interior 132 of a reaction cell 102. For example, in a single assembly 101 of the system 100, the liquid material 107 may be transported from a liquid source 106 to the inlet 116 of a reaction cell 102 through a source-cell conduit 104. After entering the interior of the reaction cell 132, the liquid material may then pass through the showerhead device 302, aligned substantially parallel with the surface of the substrate 114. The showerhead device 302 may act to diffuse the liquid material 107 prior to deposition onto the substrate 114 surface. Upon emerging from the showerhead device 302, the spray of liquid material 122 may follow a path substantially perpendicular with respect to the substrate 114 (i.e., path is substantially vertical) before being deposited onto the surface of the substrate 114.

In another embodiment, one or more showerhead devices 302 may include an inlet configured to directly fluidically couple the showerhead device 302 to a source-cell conduit 104. For example, the liquid material 107 may be transported from the liquid source 107 to the inlet of a showerhead device 302 through a source-cell conduit 104. The showerhead device 302 may be arranged to effectively function as the inlet of a reaction cell 102. After entering the inlet of the showerhead device 302 and then passing through the openings 304 of the showerhead device 302, the liquid spray 122 may enter the interior 132 of the reaction cell 102. After entering the interior 132 of the reaction cell 102, the spray of material 122 may follow a path substantially perpendicular with respect to the substrate (i.e., path is substantially vertical) before being deposited onto the surface of the substrate 114.

In some embodiments, one or more showerhead devices 302 may include a disk shaped showerhead device 302 having a plurality of openings 304 configured to transport the liquid material 107 from the liquid source 106 side of the showerhead device 302 to the substrate side of the showerhead device 302. It should be appreciated that a variety of showerhead device 302 arrangements may be suitable for implementation in context of the present invention. For instance, the exact number and arrangement of showerhead device openings 304 may depend on the specific application in question.

In some embodiments, one or more showerhead devices 302 may include a metal showerhead device 302. For example, a showerhead head device 302 may include, but is not limited to, an aluminum showerhead device, a brass showerhead device, or a stainless steel showerhead device. For example, in a single assembly 101 of the system 100, a liquid material 107 may be transported from the liquid source 106 to an aluminum showerhead device. The liquid material 107 may then pass through the openings 304 of the aluminum showerhead device 302. After passing through the aluminum showerhead device 302, the diffused liquid material spray 122 may then flow from the aluminum showerhead device 302 to the surface of the substrate 114, where the liquid spray 122 may be deposited on the substrate 114 surface.

In some embodiments, one or more showerhead devices 302 may include a plastic showerhead device 302. For example, a showerhead head device 302 may include, but is not limited to, a polyvinyl chloride (PVC) showerhead device or a polytetrafluoroethylene (PTFE) showerhead device. For example, in a single assembly 101 of the system 100, a liquid material 107 may be transported from the liquid source 106 to PVC showerhead device. The liquid material 107 may then pass through the openings 304 of the PVC showerhead device 302. After passing through the PVC showerhead device 302, the diffused liquid material spray 122 may then flow from the PVC showerhead device 302 to the surface of the substrate 114, where the liquid spray 122 may be deposited on the substrate 114 surface. It should be recognized that the preceding description pertaining to material types suitable for implementation in one or more showerhead devices 302 of the present invention is not a limitation but merely an illustration as other showerhead materials may be more or less appropriate in different contexts (e.g., corrosive resistance, electrical conductivity and etc.).

It is further contemplated that the one or more showerhead devices 302 of the system 100 may be located at various distances from the surface of the substrate 114. It should be recognized that different showerhead-substrate distances may be more or less appropriate in different contexts. For instance, when choosing an appropriate distance, the specific liquid material 106 implemented, the flow rate of the liquid material 106, the size of the isolated application region, and a variety of other factors may be considered.

In a further embodiment, the showerhead device 302 may include a rotatable showerhead device. It should be recognized by those skilled in the art that utilizing a rotatable showerhead device provides for more uniform liquid material spray 122 application on the surface of the substrate.

Referring now to FIGS. 4A and 4B, it is further contemplated that a horizontal liquid application process may be employed by the present invention. The horizontal non-contact application system 400 may include an injection element 402 (e.g., an injection bar). For example, a liquid material 107 may be supplied from a liquid material source 106 to an inlet of an injection element 402. The injection element 402 may then apply a portion of the liquid material 107 by depositing droplets of the liquid material 107 onto the surface of the substrate 114 via an injection element 402 outlet 403. Further, the horizontal non-contact deposition system 400 may include a horizontal gas curtain element 406 (e.g., gas curtain bar). For example, an inert gas (e.g., nitrogen or argon) may be supplied from an inert gas source to an inlet 405 of the horizontal gas curtain element 406. The gas curtain element 406 may then act to contain the applied liquid material 106 by directing a gas flow 408 emanating from a curtain element outlet 407 toward the edge of the selected region 108 of liquid material deposition. In addition, the horizontal non-contact deposition system 400 may include a vacuum element 404 (e.g., a vacuum bar). For example, the vacuum bar 404 may act to uptake liquid material 106 that flows from the gas curtain element 406 and the injection element 402 toward the vacuum bar 404.

Referring now to FIG. 5, a method 500 for combinatorial non-contact wet processing is described in accordance with the present disclosure. It is contemplated that the method described below may be carried out utilizing the system 100 described in the present disclosure. The method 500 for combinatorial non-contact wet processing includes providing 502 a liquid material 107. Then, the method 500 includes transporting a first portion 504 of the liquid material 107 from a source of the liquid material 106 to a first reaction cell 102, wherein the first reaction cell 102 is configured for positioning at a first selected distance from the surface of a substrate. For example, the first portion of the liquid material 107 may be transported from the liquid material source 106 to the first reaction cell 102 via the source-cell conduit 104. Next, the method 500 includes transporting at least a second portion 506 of the liquid material 107 from the source of the liquid material 106 to at least a second reaction cell 102, wherein the at least a second reaction cell is configured for positioning at a second selected distance from the surface of a substrate. Then, the method 500 includes converting the first portion 508 of the liquid material 107 to a first atomized spray of liquid particles. For example, a plurality of gas jets 110 disposed within the interior of a reaction cell 102 may be utilized to convert the liquid material 107 into a first spray of liquid material 122. Next, the method 500 includes converting the at least a second portion 510 of the liquid material 107 to at least a second atomized spray of liquid particles 122. Then, the method 500 includes containing a portion of the first atomized spray 512 of liquid particles within a first selected region 108 of the substrate 114. For example, a vacuum element 127 may be utilized to contain the first liquid material within a first selected region 108 of the substrate. Next, the method 500 includes containing a portion of the at least a second atomized spray 514 of liquid particles within at least a second selected region of the substrate. Similarly, a vacuum element 127 may be utilized to contain the second spray of liquid material within a second selected region 108 of the substrate. Then, the method 500 includes applying 516 a portion of the first atomized spray of particles onto the first selected region of the substrate. Next, the method includes applying a portion of the at least a second atomized spray of particles onto the at least a second selected region of the substrate.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An apparatus for non-contact wet processing, comprising:
    a source of a liquid material;
    a reaction cell, wherein the reaction cell is configured for positioning at a selected distance from a surface of a substrate,
    wherein the reaction cell includes a liquid inlet, the liquid inlet configured to transfer the liquid material from the liquid source to an interior of the reaction cell;
    a plurality of gas jets disposed within the interior reaction cell, the gas jets configured to atomize the liquid material transferred to the interior of the reaction cell;
    a vacuum element, the vacuum element disposed along an entire periphery of the reaction cell, the vacuum element configured to evacuate portions of the liquid material at the outer edge of a selected region of the surface of the substrate such that the liquid material that remains on the surface of the substrate is contained within the selected region; and
    at least one gas curtain element configured to flow a gas at the entire periphery of the reaction cell in order to further contain the liquid material within the selected region of the surface of the substrate.

2. The apparatus for non-contact wet processing of claim 1, wherein the at least one gas curtain element comprises:
    a gas curtain ring, wherein the gas curtain ring is disposed along a circumferential periphery of the reaction cell.

3. The apparatus for non-contact wet processing of claim 1, wherein the at least one gas curtain element comprises:
    a gas curtain bar, wherein the gas curtain bar is disposed along an edge of the reaction cell.

4. The apparatus for non-contact wet processing of claim 1, wherein at least two or more of the plurality of gas jets are arranged so as to intersect a first gas stream from a first gas jet and at least a second gas stream from a second gas jet at a selected spatial point within the interior of the reaction cell.

5. The apparatus for non-contact wet processing of claim 1, wherein the selected distance is a function of a material property of the substrate.

6. The apparatus for non-contact wet processing of claim 1, wherein the selected distance is a function of a material property of the liquid material.

7. The apparatus for non-contact wet processing of claim 1, wherein the liquid inlet comprises:
    a showerhead device.

8. The apparatus for non-contact wet processing of claim 1, wherein the vacuum element comprises:
    a vacuum ring, wherein the vacuum ring is disposed along a circumferential periphery of the reaction cell.

9. The apparatus for non-contact wet processing of claim 1, wherein the vacuum element comprises:
    a vacuum bar, wherein the vacuum bar is disposed along an edge of the reaction cell.

10. An apparatus for combinatorial non-contact wet processing, comprising:
    a source of a liquid material;
    a first reaction cell, wherein the first reaction cell is configured for positioning at a first selected distance from the surface of a substrate;
    at least a second reaction cell, wherein the at least a second reaction cell is configured for positioning at a second selected distance from the surface of a substrate,
    wherein the first reaction cell and the at least second reaction cell include a liquid inlet;
    a first plurality of gas jets disposed within an interior of the first reaction cell, the first plurality of gas jets configured to atomize the liquid material transferred to the interior of the first reaction cell;
    at least a second plurality of gas jets disposed within an interior of the at least second reaction cell, the at least second plurality of gas jets configured to atomize the liquid material transferred to the interior of the at least second reaction cell;
    a first vacuum element, the first vacuum element disposed along an entire periphery of the first reaction cell, the first vacuum element configured to evacuate portions of the liquid material at the outer edge of a first selected region of the surface of the substrate such that the liquid material that remains on the surface of the substrate is contained within the first selected region of the surface of the substrate;
    a first gas curtain element configured to flow a gas at the entire periphery of the first reaction cell in order to further contain the liquid material within the first selected region of the surface of the substrate;
    at least a second vacuum element, the at least second vacuum element disposed along an entire periphery of the at least second reaction cell, the at least second vacuum element configured to evacuate portions of the liquid material at the outer edge of a second selected region of the surface of the substrate such that the liquid material that remains on the surface of the substrate is contained within the second selected region of the surface of the substrate; and
    at least a second gas curtain element configured to flow a gas at the entire periphery of the at least second reaction cell in order to further contain the liquid material within the second selected region of the surface of the substrate.

11. The apparatus for combinatorial non-contact wet processing of claim 10, further comprising:

a liquid flow control system configured to control a flow of the liquid material from the source of a liquid material to at least one of the first reaction cell or the at least a second reaction cell.

12. The apparatus for combinatorial non-contact wet processing of claim 10, further comprising:
a gas flow control system configured to control a flow of a gas through at least one of the first plurality of gas jets or the at least a second plurality of gas jets.

13. The apparatus for combinatorial non-contact wet processing of claim 10, wherein the liquid inlet comprises:
a liquid inlet configured to transfer the liquid material from the source of the liquid material to an interior of at least one of the first reaction cell or the at least a second reaction cell.

* * * * *